United States Patent [19]

Christopher

[11] Patent Number: 4,823,302

[45] Date of Patent: Apr. 18, 1989

[54] BLOCK ORIENTED RANDOM ACCESS MEMORY ABLE TO PERFORM A DATA READ, A DATA WRITE AND A DATA REFRESH OPERATION IN ONE BLOCK-ACCESS TIME

[75] Inventor: Todd J. Christopher, Indianapolis, Ind.

[73] Assignee: RCA Licensing Corporation, Princeton, N.J.

[21] Appl. No.: 8,695

[22] Filed: Jan. 30, 1987

[51] Int. Cl.[4] .......................... G06F 12/00; G11C 7/00
[52] U.S. Cl. ...................................... 364/900; 365/221
[58] Field of Search ... 364/200 MS File, 900 MS File; 365/219–221, 230, 239, 240

[56] References Cited

U.S. PATENT DOCUMENTS

| | | | |
|---|---|---|---|
| 3,956,737 | 5/1976 | Ball | 340/172.5 |
| 4,321,695 | 3/1982 | Redwine et al. | 365/174 |
| 4,415,994 | 11/1983 | Ive et al. | 365/189 |
| 4,435,792 | 5/1984 | Bechtolsheim | 365/230 |
| 4,558,377 | 12/1985 | Collins et al. | 360/10.1 |
| 4,633,441 | 12/1986 | Ishimoto | 365/189 |

OTHER PUBLICATIONS

Nogami, Kazutaka et al., "1-MBIT Virtually Static RAM" IEEE Journal of Solid State Circuits, vol. SC-21, No. 5, 10/86.

Kimura, Katsutaka et al., "Power Reduction Techniques in Megabit Dram's", IEEE Journal of Solid State Circuits, vol. SC21, No. 3, 61.

Ohta, Kiyoto et al., "A 1-MBIT Dram with 33-Mhz Serial I/O Ports", IEEE Journal of Solid State Circuits, vol. SC-21, No. 5, 10/86.

Primary Examiner—Thomas M. Heckler
Assistant Examiner—Joseph T. Fitzgerald
Attorney, Agent, or Firm—Eugene M. Whitacre; Paul J. Rasmussen; Eric P. Herrmann

[57] ABSTRACT

A video memory system which uses dynamic digital data storage elements allows random access to blocks of 32 pixel values. The pixel values to be stored in a block are applied sequentially to the memory system and the pixel values provided by the memory system are provided sequentially. The block oriented random access memory which stores and provides the blocks of 32 pixel values is configured to be able to perform a block read, a block write and a refresh operation in the time required to provide one 32 pixel block to or from the video memory system.

10 Claims, 3 Drawing Sheets

BLOCK ORIENTED RANDOM ACCESS MEMORY ABLE TO PERFORM A DATA READ, A DATA WRITE AND A DATA REFRESH OPERATION IN ONE BLOCK-ACCESS TIME

This invention relates to a block oriented digital memory system which has serial data input and data output ports and which has a block size sufficient to allow a memory read operation, a memory write operation and a memory refresh operation to occur in the time used to provide one block of data values via the serial input or serial output ports.

The design of a memory system used for field or frame based video signal processing in a consumer television receiver is subject to several constraints affecting both the performance and cost of the memory system. First, the memory system should accept and supply pixel samples at standard video rates. A commonly used video sampling rate in NTSC receivers, for example, is 14.32 MHz, or $4f_{sc}$, four times the frequency, $f_{sc}$ (3.58 MHz), of the color subcarrier signal component of the composite video signal. This sampling rate is preferred because it simplifies the processing of the color signal components of the composite video signal. As a second constraint, the memory system should include a sufficient number of storage elements to hold pixels representing one field of the video signal. This number of storage elements depends on the signal standard and on the sampling rate. For example, in the NTSC system 238,875 pixel storage elements are needed to represent one field of a video signal that is sampled by a 14.32 MHz sampling clock signal. Third, the memory system should be able to be configured as delay element or as a random access memory. When the memory system is configured as a delay element, the pixels provided at the output port are delayed by a fixed amount of time, for example, one field period, with respect to the samples applied to the input port. In this mode, the memory system may be part of a field progressive scan system, frame comb filter or temporal noise reduction system. When the memory system is configured as a random access memory, blocks of pixels may be written or read in an arbitrary sequence. This mode is useful for features which produce an on-screen display or for producing picture-within-a-picture (pix-in-pix) or magnified picture (zoom) displays. A fourth constraint which affects the design of a video memory system is its cost. Desirably, the memory system should be inexpensive and should not need expensive peripheral circuitry to integrate it into the television receiver.

Previously, random access memory (RAM) integrated circuits developed for computers and other data processing applications have been adapted for video signal processing. These integrated circuits are usually designed for the random access of individual multi-bit data words using a single data bus for both input and output. To use these memory circuits in a video memory system, it is necessary to use peripheral circuitry to control the sequence of addresses applied to the memories and to schedule the read and write requests to avoid conflicting uses of the data bus.

One attempt to design a memory integrated circuit specifically for video signal processing applications is described in the paper entitled "A 1-M bit DRAM with 33-MHz Serial I/O Ports" by Ohta et al., IEEE Journal of Solid State Circuits, Vol. SC-21, No. 5, October 1986, which is hereby incorporated by reference. The integrated circuit described in this reference has two four-bit serial ports, one each for data input and data output. In the memory circuit, four-bit data storage elements are arranged in blocks of eight. Four-bit nibbles representing portions of pixel values are applied to the input port at a 33 MHz rate. The nibbles are loaded into a serial-to-parallel input buffer which collects eight nibbles before writing them into a block of storage elements. Similarly, a block of eight nibbles is read from the memory into a parallel-to-serial buffer which provides eight four-bit nibbles representing portions of pixel values in a serial stream at the 33 MHz rate. The read and write operations may be interleaved to achieve continuous data input and output at the 33 MHz rate. There is no indication in this paper, however, of how the refresh operations are integrated into the interleaved read and write operations. Since this memory system stores and provides data in four-bit nibbles, two of these memory systems are needed for processing eight-bit pixel values at the 33 MHz rate.

Although the memory system described in the above-reference paper includes circuitry to control data bus contention resulting from coincident read and write requests, it does not significantly improve the memory address interface over that which is provided by random access memory circuits designed for data processing applications. Accordingly, the integrated circuit described in the above-referenced paper may need extensive peripheral circuitry to control the proper sequencing of address values applied to the memory circuitry to read, write and refresh the stored data values. In addition, because the address values are applied to the integrated circuit in parallel, it is contained in a 40-pin package. This is a relatively large package which may be too costly to use in an inexpensive consumer television receiver.

SUMMARY OF THE INVENTION

The present invention is embodied in a digital data memory system which includes a plurality of memory blocks, each having D data storage elements. These memory blocks are coupled to circuitry which writes data into a first selected memory block, reads data from a second selected block and refreshes the data held by at least a third selected block in respective, mutually exclusive time intervals $T_{WR}$, $T_{RD}$, and $T_{RF}$. The D data values provided from the second selected block during the time interval $T_{RD}$ are stored in parallel into an output buffer. Data values are provided by the output buffer sequentially, synchronous with D successive pulses of a data output clock signal having a nominal frequency of $f_c$. The value of D is chosen such that the amount of time represented by the mathematical expression $D/f_c$ is not less than the sum of the lengths of the time intervals $T_{WR}$, $T_{RD}$, and $T_{RF}$.

DETAILED DESCRIPTION

Figure 1:
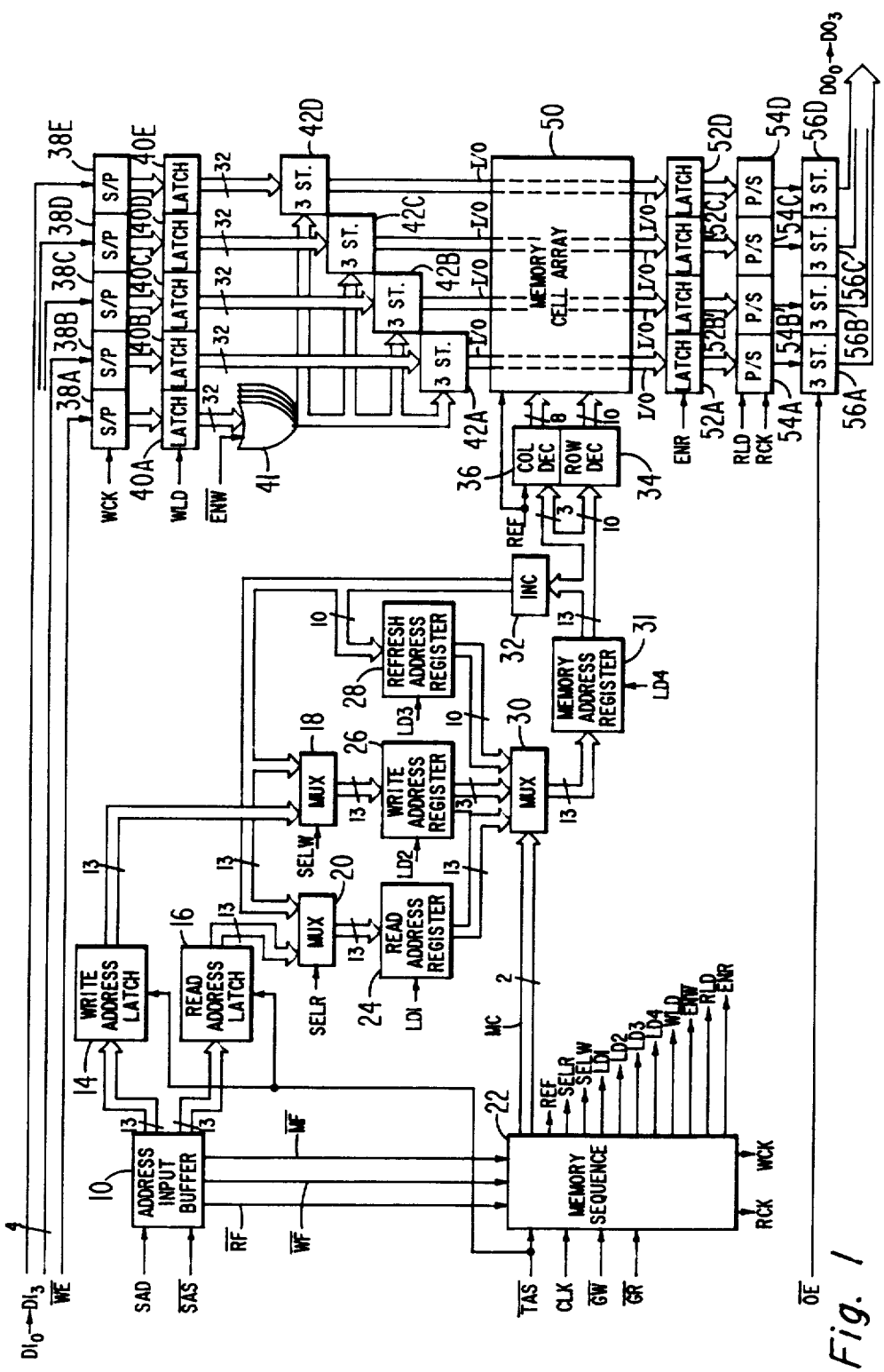
FIG. 1 is a block diagram of a memory system which includes an embodiment of the present invention.

In the drawings, broad arrows represent busses conveying multiple-bit parallel digital signals and line arrows represent connections conveying single-bit digital signals. Depending on the processing speed of the devices, compensating delays may be required in certain of the signal paths. One skilled in the art of digital memory circuit design would know where such delays are needed in a particular system. The memory system described below accepts and provides four-bit nibbles at the NTSC sampled data video rate of 14.32 MHz. To simplify the explanation of this memory system, these four-bit nibbles are referred to as pixel values. A memory system which operates at 14.32 MHz and uses eight-bit pixel values may be built by configuring two of these memory systems in parallel.

FIG. 1 is a block diagram of a video memory system which may be realized as a single 18-pin integrated circuit. The pin designations correspond respectively to signal names used in FIG. 1 as shown in TABLE 1.

TABLE I

| Pin/Signal Name | Function |
| --- | --- |
| $DI_0 \rightarrow DI_3$ | 4 data input signals |
| $\overline{WE}$ | write enable signal (active low) |
| SAD | serial address signal |
| $\overline{SAS}$ | address clock signal |
| $\overline{TAS}$ | address transfer signal (active low) |
| CLK | system clock signal |
| $\overline{GW}$ | write clock gate signal (active low) |
| $\overline{GR}$ | read clock gate signal (active low) |
| $\overline{OE}$ | output enable signal (active low) |
| $DO_0 \rightarrow DO_3$ | 4 data output signals |

The two remaining pins are for coupling the integrated circuit to a source of operating potential and a source of reference potential (e.g. ground).

The memory system shown in FIG. 1 may include, for example, a sufficient number of bit storage elements (cells) in the memory cell array 50 to hold 262,144 ($2^{18}$) four-bit pixel values. This number of cells is sufficient to hold, for example, one field (238,875 four-bit pixel value) of a sampled data NTSC video signal having a sampling frequency of 14.32 MHz ($4f_c$).

This memory system is able to accept and supply four-bit pixel values at standard video rates. The pixel values applied to the memory system may be written into storage cells addressed by a write address value while other pixel values held in storage cells addressed by an independent read address value are provided by the memory system. The write and read address values are incremented as the pixel values are accepted and provided in order to maintain continuous input and output data streams. The address values may be changed and read or write operations may be enabled or inhibited by loading address and control values into the memory system via the serial address input terminal SAD. Another function of the control value loaded via the SAD terminal is to allow the memory read and write operations to be synchronized to the signal $\overline{TAS}$.

A structural overview of the memory system is presented first, followed by a more detailed description. The latter part of this detailed description includes an example of the internal sequencing of the memory illustrating its operational modes.

Four-bit pixel values, applied to the data input terminals $DI_0$ through $DI_3$, are stored sequentially in respective serial-to-parallel converters 38B through 38E. The serial-to-parallel converters 38 collect, for example 32 pixel values during 32 successive periods of a write clock signal, WCK, and then transfer the collected pixel values as a single block of data into buffer latches 40B through 40E respectively. This transfer occurs in a fraction of the next successive clock period. The pixel values are transferred from the latches 40 to the memory cell array 50 during several of the ensuing 32 clock periods while new pixel values are loaded into the serial-to-parallel converters 38. Similarly, a block of 32 pixel values is read from the memory cell array 50 over several periods of a read clock signal, RCK, and stored in output buffer latches 52A through 52D. From the latches 52A through 52D, the block of pixel values is transferred to respective parallel-to-serial converters 54A through 54D during a portion of one of the read clock cycles. The parallel-to-serial converters 54 then provide the individual four-bit pixel values, synchronous with the read clock signal, RCK, via the output terminals $DO_0$ through $DO_3$ over the next 32 periods of the signal RCK.

The addresses applied to the cell array 50 and the control signals, which determine when the data are transferred from the serial-to-parallel converters 38 and latches 40 to the memory cell array 50, and from the cell array 50 to the latches 52 and parallel-to-serial converters 54, are generated by circuitry internal to the memory system shown in FIG. 1. This circuitry, the memory sequencing circuitry 22, is controlled by externally provided address and control signal values as outlined below.

Read and write address values, each of which specifies a particular block of data cells in the memory cell array 50, are applied to the SAD input terminal of the memory system as a bit-sequential signal. The signal applied to the SAD input terminal is separated into one read address and one write address and stored in the internal read and write address registers 24 and 26 respectively.

The memory system also includes an automatic refresh function which may, for example, restore all of the data in a predetermined portion of the memory cell array in one operation. The refresh address is internally generated and stored in an internal refresh address register 28.

The memory sequencing circuitry 22 may, for example, sequentially perform a read, a write and a refresh operation on the memory cell array 50 during one 32 clock cycle interval. These operations are timed by the sequencing circuitry 22 to prevent any conflicting access to data in the memory cell array. Generally, during each of the read, write and refresh operations, the address value used to access the memory is incremented by one in address incrementing circuitry 32 and stored into the read, write or refresh address register as appropriate.

Thus, the memory system shown in FIG. 1 is capable of reading and writing pixel data using the same sequence of successive block address values or using respectively different sequences of successive block address values. When the addresses used for reading and writing the pixel data are the same, the memory system may appear to be a one-field-period delay element suitable for use in field or frame based video signal processing circuitry. When different addresses are used for reading and writing, the memory system may appear as a delay element providing a time delay of less than one field period or as a "random access" memory where the pixel data are accessed in blocks of 32 four-bit pixel values.

The following is a more detailed description of the memory system shown in FIG. 1. As set forth above, the read and write address values and the control value are applied as a bit-serial signal to the serial address input terminal SAD. In the present embodiment of the invention, each of the address values is a 13-bit value and the control value is a three-bit value. The bit-serial signal is loaded into the address input buffer 10 in synchronism with a serial address clock signal $\overline{SAS}$. The address input buffer 10 may, for example, be realized as a 29 bit serial input, parallel output shift-register. The read and write address values and the control value are applied to the serial input port and provided via parallel output ports of the buffer 10. In the bit-serial signal SAD, used in this embodiment of the invention, the bits of the read and write address values are interleaved. The most significant bits of the two address values are the first two bits of the signal followed by the next most significant bits of the two address values and continuing on to the least significant bits. The three-bit control signal is appended to the interleaved addresses following the least significant bits of the two address values. The signal $\overline{TAS}$ is coupled to the read and write address latches 16 and 14 to control the transfer of the read and write address values from the address input buffer 10 to the respective latches 16 and 14. Each of the latches 16 and 14 may include, for example, 13 data-type flip-flops arranged as a parallel-in-parallel-out register. The address values provided by the buffer 10 are loaded into the latches 16 and 14 on the negative-going edge of the signal $\overline{TAS}$.

The timing of an address load and transfer is shown in FIG. 2. At time $TA_0$, in this example, the memory system contains pixel data but has no outstanding read, write or refresh operations scheduled. The first bit of a new pair of address values $AR_0$ and $AW_0$ is applied to the address input terminal SAD at time $TA_0$. The individual bits of the read address value, $AR_0$, and write address value, $AW_0$, and the three-bit control value are sequentially loaded into the address input buffer 10, one bit per period in the 29 periods of the signal $\overline{SAS}$ following time $TA_0$. At time $TA_1$, the address input buffer 10 contains a 13 bit read address value, a 13 bit write address value and a three-bit control value. On the negative going edge of the signal $\overline{TAS}$, occuring at $TA_1$, the read and write address values are transferred to the respective read and write address latches 16 and 14 and the three-bit control value is transferred to the memory sequencing circuitry 22.

The three control bits, designated $\overline{RF}$, $\overline{WF}$ and $\overline{MF}$, from the input buffer 10, and the signal $\overline{TAS}$ are applied to the memory sequencing circuitry 22 to control the operation of the memory system. The bits $\overline{RF}$ and $\overline{WF}$ control whether data are read from or written to the pixel storage elements addressed by the respective read and write address values in the respective latches 16 and 14. The bit $\overline{MF}$ determines whether these read and write operations are synchronized by circuitry internal to the memory system or by the externally supplied signal $\overline{TAS}$. The function of the control signals $\overline{RF}$, $\overline{WF}$ and $\overline{MF}$ are summarized in Table 2.

TABLE 2

| Control Bit | Value | Effect |
|---|---|---|
| $\overline{RF}$ | 0 | read operation enabled |
|  | 1 | read operation disabled |
| $\overline{WF}$ | 0 | write operation enabled |
|  | 1 | write operation disabled |
| $\overline{MF}$ | 0 | read and/or write synchronized to TAS |
|  | 1 | read and/or write operation internally synchronized |

Figure 2A:
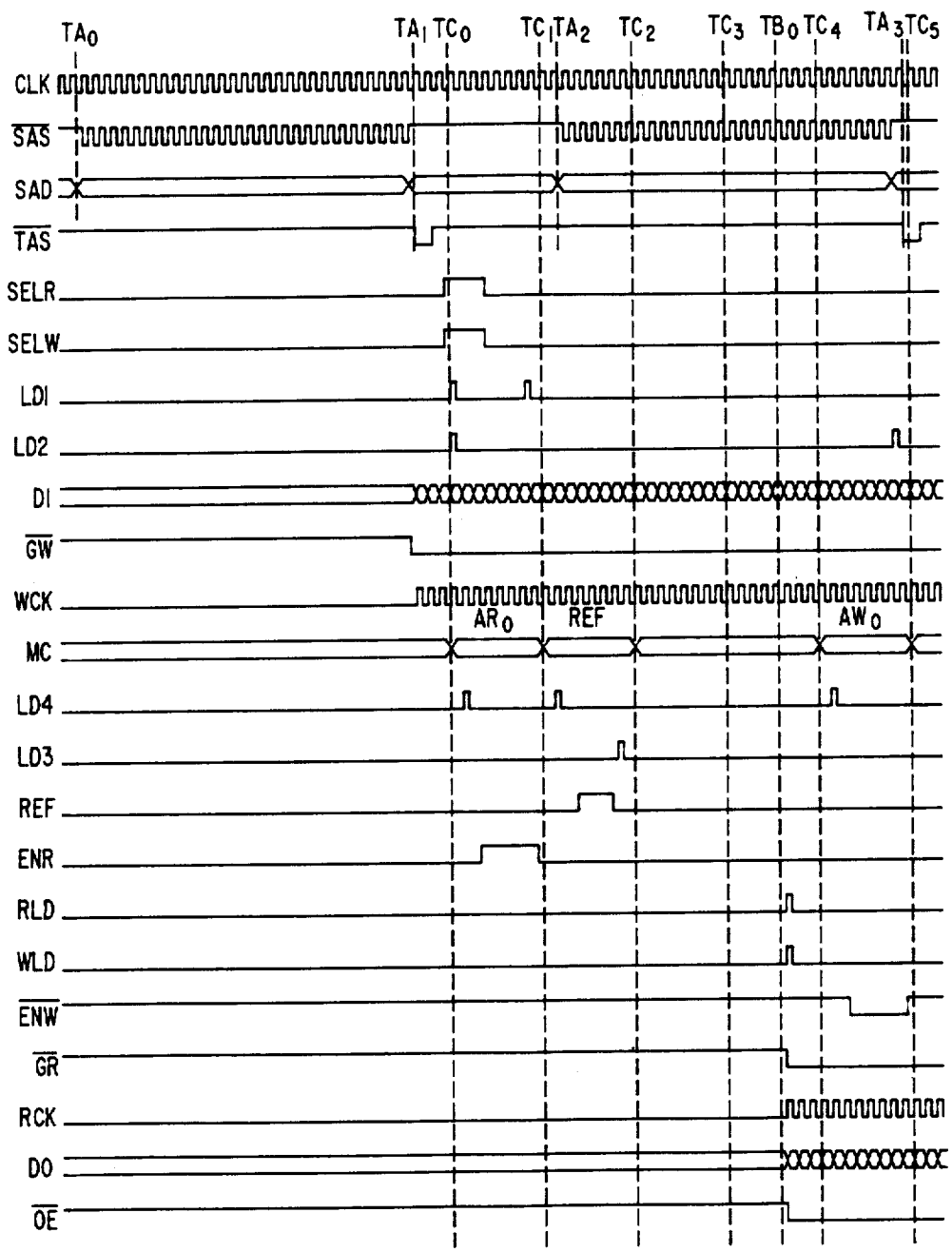
FIGS. 2A and 2B show timing diagrams of several signals that are useful in explaining the operation of the memory system shown in FIG. 1.

In the example shown in FIG. 2A, the three control bits, $\overline{RF}$, $\overline{WF}$ and $\overline{MF}$ provided at time $TA_1$ all have values of logic zero. Accordingly, data applied to the memory system via the input terminals $DI_0$ through $DI_3$ after time $TA_1$ will be written into the pixel storage elements addressed by the newly supplied write address value, $AW_0$; data provided via the output terminal $DO_0$ through $DO_3$, after a suitable delay (e.g. 32 periods of the signal CLK) will be data from the pixel storage elements addressed by the newly supplied read address value, $AR_0$, and the read and write operations using these address values are initiated by the negative going edge of the signal $\overline{TAS}$.

Referring to FIG. 1, the read and write address values held by the latches 16 and 14, respectively, are applied to respective first input ports of the multiplexers 20 and 18. Second input ports of the multiplexers 20 and 18 are coupled to the output port of the address incrementing circuitry 32. The multiplexers 20 and 18 are controlled by the respective control signals SELR and SELW provided by the memory sequencing circuitry 22. When new address values are available in latches 16 and 14, the memory sequencing circuitry 22 pulses the signals SELR and SELW, two and one-half master clock pulses after the negative going edge of the signal $\overline{TAS}$ to condition the respective multiplexers 20 and 18 to apply the address values $AR_0$ and $AW_0$ held by the respective latches 16 and 14 to the input ports of the read address register 24 and write address register 26, respectively. When new address values are not available in the latches 16 and 14 the signals SELR and SELW condition the multiplexers 20 and 18 to apply the address value provided by the address incrementing circuitry 32 to the input port of the respective read and write address registers 24 and 26. The read address register 24 and write address register 26 are controlled by respective signals LD1 and LD2 provided by the memory sequencing circuitry 22 to load new read and write address values, respectively, when the signals SELR and SELW are pulsed or when respective incremented read and write address values are available at the output port of the incrementing circuitry 32.

In addition to the 13-bit read and write address values held by the registers 24 and 26, a 10-bit refresh address value, held by a refresh address register 28, is applied to the multiplexer 30. The input port of the refresh address register 28 is coupled to the output port of the incrementing circuitry 32. The ten least significant bits of the value provided by the incrementing circuit 32 are stored in the refresh address register coincident with a pulse of the signal LD3 provided by the memory sequencing circuitry 22.

The multiplexer 30 is controlled by a two-bit signal MC provided by the memory sequencing circuitry 22. The signal MC conditions the multiplexer to apply either the read address value from register 24, the write address value from register 26 or the refresh address value from register 28 to the memory address register 31. The selected address value is loaded into the register 31 coincident with the positive-going edge of signal LD4 provided by the memory sequencing circuitry 22.

The 13-bit address value held by the memory address register 31 is applied to the address incrementing circuitry 32. The circuitry 32 may include, for example, a 13-bit binary adder (not shown) having the value held by the register 31 applied to one input port and a value of one applied to the other input port. The address value available at the output port of the incrementing circuitry 32 is applied to the refresh address register 28 and to the second input ports of the multiplexers 18 and 20 as set forth above.

To understand how the individual data storage elements are addressed by the address value held in the register 31, it is convenient to regard the memory cell array as a matrix of blocks of pixel cells. The matrix has $2^{10}$ (1024) rows and $2^3$ (8) columns. Each unique combination of a row and column address value corresponds to a respectively different block of 32 four-bit pixel storage cells. To access a particular block of cells, the ten least significant bits of the address value held by the memory address register 31 are applied to row address decoding circuitry 34 and the three most significant bits are applied to column address decoding circuitry 36. The row decoding circuitry 34, which may be of conventional design, decodes the ten least significant bits of the address value to select one of the 1024 rows, and the column decoding circuitry 36, which may be of conventional design, decodes the three most significant bits of the address value to select one of the eight columns. The block of pixel storage cells selected by the row and column decoding circuitry 34 and 36 is gated onto a 32×4(128) bit data bus, I/O, by conventional circuitry. The data bus I/O is coupled to the data input gating circuits 42A through 42D and to the data output latches 52A through 52D.

Data are provided to the memory cell array 50 via the data input terminals $DI_0$ through $DI_3$, serial-to-parallel converters 38B through 38E, data input latches 40B through 40E and data input gating circuits 42A through 42D.

Data applied to the write enable input terminal, $\overline{WE}$, and to the four data input terminals $DI_0$ through $DI_3$ are stored in the respective serial-to-parallel converters 38A through 38E. A new bit of data is stored in each of the five serial-to-parallel converters coincident with negative-going edge of each pulse of the clock signal WCK provided by the memory sequencing circuitry 22. The signal WCK may be, for example, the logical AND of the system clock signal CLK and an inverted version of the write clock gate signal $\overline{GW}$. When the signal $\overline{GW}$ is a logic one, the clock signal WCK is disabled and, so, data values applied to the serial-to-parallel converters 38 are not stored. When the signal $\overline{GW}$ is a logic zero, however, the signal WCK is enabled and data are stored in the converters 38 synchronous with the negative-going edges of the clock signal CLK.

In this embodiment, the memory sequencing circuitry 22 counts pulses of the signal WCK, as set forth below, to determine when the data held in the serial-to-parallel converters 38 is to be transferred to the five 32-bit latches 40A through 40E. The latches 40A through 40E, each of which may include, for example, 32 data-type flip-flops configured as a parallel-in-parallel-out register, are controlled by the memory sequencing circuitry 22 to load the 32 four-bit pixel values and the corresponding 32 bits of the signal $\overline{WE}$ coincident with the positive-going edge of a signal WLD.

The output values from the 32-bit latches 40B through 40E are applied to respectively different ones of the data input gating circuits 42A through 42D. Each of these gating circuits includes, for example, 32 three-state gates (not shown). Each of the three-state gates in a gating circuit is connected to a respectively different output terminal of its associated data input latch. The output terminals of the three-state gates are coupled to respectively different bit lines of the data bus I/O. The 32 three state gates in each of the gating circuits 42 are controlled by the signals generated by respectively different ones of the 32 OR gates 41. The OR gates 41 combine a signal $\overline{ENW}$ and corresponding bit values of the 32-bit signal $\overline{WE}$ stored in the register 40A in a logical OR function to generate 32 control signals applied to the 32 three-state gates of each of the data input gating circuits 42.

The memory sequencing circuitry 22 provides a logic zero value for the signal $\overline{ENW}$ to transfer, to the memory cell array 50, the four-bit pixel values held in the latches 40B through 40E, as masked by the values of the signal $\overline{WE}$ Held in latch 40A. The signal $\overline{WE}$ masks the pixel values as follows. When a bit of the signal $\overline{WE}$ is a logic zero, the corresponding three state gates in each of the gating circuits 42A through 42D are enabled to apply the corresponding four-bit pixel value to the data bus I/O of the memory cell array 50. When a bit of the signal $\overline{WE}$ is a logic one, however, the corresponding three-state gates in each of the input gating circuits 42A through 42D present a high impedance to the data bus I/O. Under these conditions, the value currently held in the corresponding pixel value storage cell of the addressed block in the memory cell array 50 is re-written into that storage cell. By this operation, a logic one of the input terminal $\overline{WE}$ effectively masks the corresponding pixel data value applied to the input terminal $DI_0$ through $DI_3$ by preventing it from being written into the memory cell array 50.

A memory read operation proceeds as follows in this embodiment of the invention. Thirty-two four-bit pixel values are transferred from an addressed block of pixel value storage cells in the memory cell array 50 to the data output latches 52A through 52D when the signal ENR, supplied by the memory sequencing circuitry 22, has a value of logic-one. Each of the data output latches 52A through 52D may include, for example, 32 data-type flip-flops configured as a parallel-in-parallel-out register. The 32 four-bit pixel values held in the latches 52A through 52D are transferred into four 32-bit parallel-to-serial converters 54A through 54D, respectively, coincident with the positive-going edge of a pulse of the signal RLD, supplied by the memory sequencing circuitry 22. Each of the parallel-to-serial converters 54A through 54D may include, for example, 32 data type flip-flops configured as a parallel-in-serial-out shift register.

Each of the parallel-to-serial converters 54 provides one-bit of the 32 four-bit pixel values synchronous with a read clock signal RCK, provided by the memory sequencing circuitry 22. The signal RCK may be, for example, the logical AND of the master clock signal CLK and an inverted version of the read clock gate signal $\overline{GR}$.

In order to maintain a continuous stream of four-bit pixel values from the parallel-to-serial converters 54, the memory sequencing circuitry 22 may include, for example, a counter (not shown) which counts the pulses of the signal RCK. This counter is reset when new pixel values are loaded into the parallel-to-serial converters 54. When the counter has counted 32 pulses of the signal RCK (indicating that the 32 pixel values have been shifted out of the converters 54), the memory sequencing circuitry 22 pulses the signal RLD to load 32 new pixel values into the converters 54 and resets the RCK counter (not shown).

The output terminals of the four parallel-to-serial converters 54A through 54D are coupled to respective three-state gate circuits 56A through 56D. The three-state gate circuits 56 are controlled by an externally supplied output enable signal $\overline{OE}$. When the signal $\overline{OE}$ has a value of logic one, the three state gate circuits 56 present a high impedance at the output terminals $DO_0$ through $DO_3$. When the signal $\overline{OE}$ has a logic zero value, however, the circuits 56 present the logic values, applied to their input terminals, at the output terminals $DO_0$ through $DO_3$.

In addition to controlling the reading of data from, and writing of data into the memory cell array 50, the memory sequencing circuitry 22 also controls the periodic refreshing of data values stored in the memory cell array 50. To understand how the refresh operation occurs, it is helpful to first understand why the data values are refreshed. In the embodiment of the invention shown in FIG. 1, the memory cell array 50 is composed of $2^{20}$ (1,048,576) dynamic bit-storage cells arranged as $2^{13}$ (8,192) blocks of 32 four-bit pixel storage cells. A datum is stored in one of these dynamic bit-storage cells as a charge or absence of a charge on a capacitor (not shown). This charge is not stable and tends to dissipate over time. Consequently, the memory system includes an automatic refresh operation which periodically restores the charge on all of the capacitors to maintain the data in the storage cells. To understand how the refresh operation is performed, it is helpful to know the general structure of the memory cell array. The memory cell array 50 used in the present embodiment of the invention may be considered to be organized as a matrix having 1024 rows, 256 columns and four bit planes. The four bit planes correspond, respectively, to the four bits of pixel values. The 256 columns on each bit plane are organized in eight groups where each group includes 32 columns, all 32 columns in a given group have the same column address. In this memory organization, each of the 256 columns in each of the four bit planes has a separate sense amplifier (not shown). When the sense amplifier is gated onto the bus I/O, the charge on the capacitor of the addressed bit cell may be read onto the bus or written from the bus (i.e. changed to equal the new bit value applied via the bus I/O). In a refresh operation, the bit values provided by the sense amplifiers are not gated onto the data bus, consequently, all eight column select lines from the column decode circuitry 36 may be activated for each 10-bit row address provided to the row address decoder 34. Thus, each refresh operation restores 256 pixel values (1024 bits of data). All of the data in the memory cell array 50 may be refreshed in 1024 refresh operations (i.e. a refresh operation for each row in the matrix).

The automatic refresh system used in the memory system shown in FIG. 1 refreshes all of the bit-storage cells in the memory cell array in less than 5 milliseconds. To do this, one row of the memory cell array is refreshed every 64 cycles of the clock signal CLK. A typical refresh operation proceeds as follows. Once a refresh address has been established, the memory sequencing circuitry 22 pulses a signal REF applied to the column decoding circuitry 36 and to the memory cell array 50 to activate the sense amplifiers in all 256 columns on all four-bit planes of the memory cell array 50 and to inhibit the gating of the sense amplifiers to the data bus. The sense amplifiers read and restore the data held in each of the dynamic bit storage cells in the addressed row.

The structure of the individual memory bit storage cells and of the sense amplifiers depends on the technology (e.g. NMOS or CMOS) used to implement the memory system and may also depend on factors such as the desired data access time and the power dissipation for the memory system. Exemplary circuitry for implementing the memory storage cells, sense amplifiers and address decoders is shown in an article by K. Kimura et al. entitled "Power Reduction Techniques in Megabit DRAM's", IEEE Journal of Solid-State Circuits, Vol. SC-21, No. 3, June 1986, pp. 381-389, which is hereby incorporated by reference.

Figure 2B:
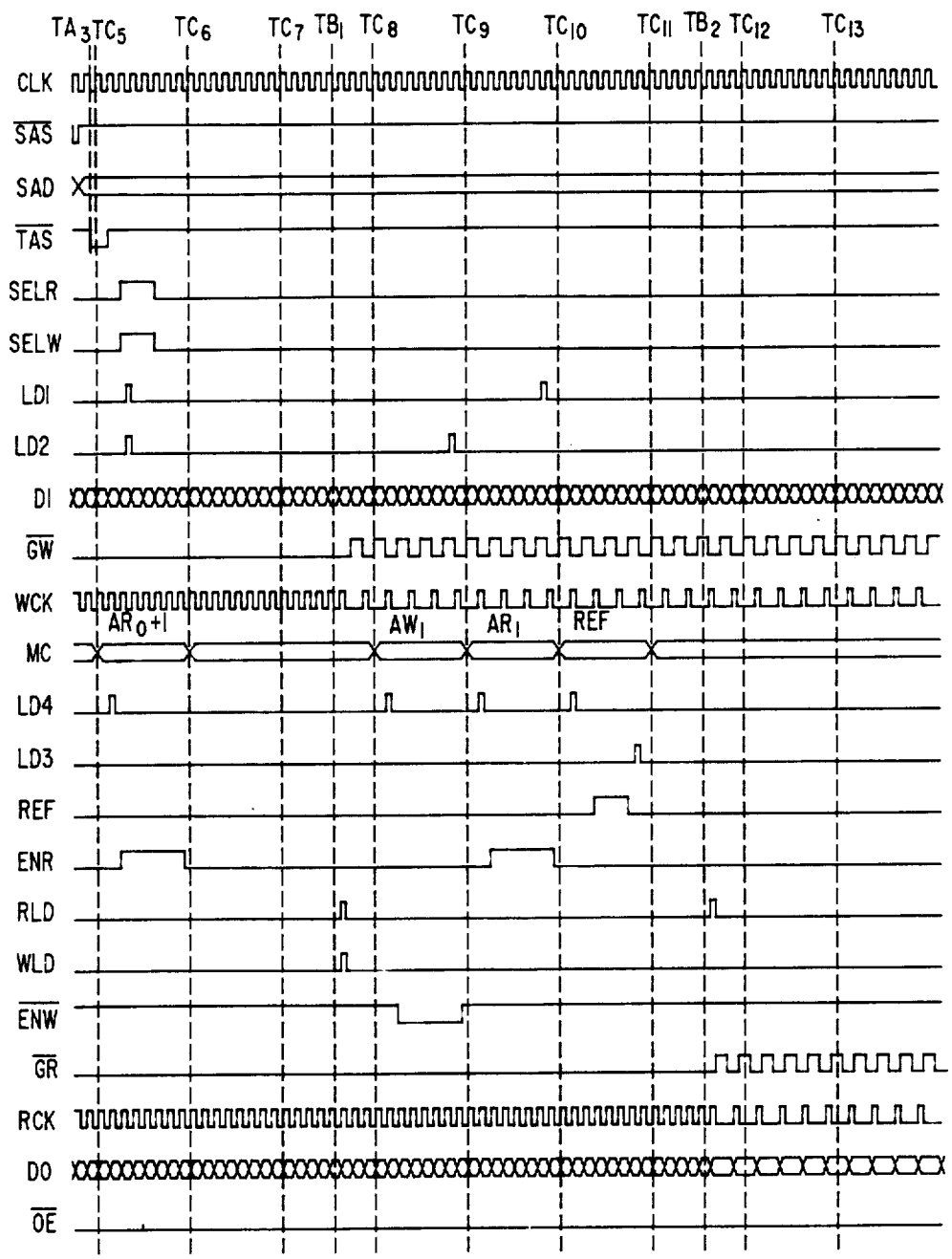

FIGS. 2A and 2B are signal timing diagrams which are useful for illustrating the operation of the memory system under the control of the memory sequencing circuitry 22. The timing values shown in these figures are specific to this embodiment of the invention. They are provided to illustrate one possible implementation of the invention.

The master clock signal CLK used in this embodiment of the invention has a frequency of 14.32 MHz, $4f_c$ in the NTSC system. The other clock signals, $\overline{SAS}$, WCK and RCK are all derived from this master clock signal.

The timing diagrams in FIGS. 2A and 2B show a series of memory functions which illustrate the operation of the memory sequencing circuitry 22. As an aid in explaining the timing diagrams, time values are marked across the top of the FIGS. 2A and 2B. The time values $TA_0$, $TA_1$, $TA_2$ and $TA_3$ designate times at which memory address events occur, either the start or finish of an address load operation. The time values $TC_0$ through $TC_{13}$ mark the boundaries of internal memory cycles, each memory cycle spans eight periods of the master clock signal CLK. Memory operations which affect the memory cell array 50 (i.e. memory read, write and refresh) occur during respectively different memory cycles and are initiated on the memory cycle boundaries. The time values $TB_0$, $TB_1$ and $TB_2$ mark times at which data are transferred from the serial-to-parallel converters 38 to the data input latches 40 and/or times at which data are transferred from the data output latches 52 to the parallel-to-serial converter 54.

Briefly, between times $TA_0$ and $TA_1$, a read address value $AR_0$ and a write address $AW_0$ are loaded into the memory system. Read operations using $AR_0$ and $AR_{0+1}$ are initiated at times $TC_0$ and $TC_5$, respectively. A write operation using memory address $AW_0$ is initiated at time $TC_4$. Between times $TA_2$ and time $TA_3$, a read address value $AR_1$ and write address value $AW_1$ are loaded into the memory system. A memory write operation using address $AW_1$ is initiated at time $TC_8$ and a read operation using address $AR_1$ is initiated at time $TC_9$. Memory refresh operations are initiated at times $TC_1$ and $TC_{10}$. These timing diagrams and the explanation set forth below define the function of the memory sequencing circuitry 22 sufficiently to allow one skilled in the art of digital logic design to assemble circuitry from conventional components which may be used as the memory sequencing circuitry 22.

To understand the sequencing of the memory system, it is convenient to separate the circuitry which processes the address and control signal values from the circuitry which performs the read, write and refresh operations. As set forth above, at time $TA_1$, the read and write address values $AR_0$ and $AW_0$ are stored in the respective read and write address latches 16 and 14. One master clock period after the signal $\overline{TAS}$ has been pulsed, the memory sequencing circuitry 22 pulses the signals SELR and SELW to condition the respective multiplexers 20 and 18 to apply these address values to the read and write address registers 24 and 26, respectively. Shortly after the positive going edges of the signals SELR and SELW, the circuitry 22 pulses the signals LD1 and LD2 to load the respective address values $AR_0$ and $AW_0$ into the respective read and write address registers 24 and 26.

As set forth above, the $\overline{MF}$ bit of the control value applied to the memory sequencing circuitry 22 at time $TA_1$ is a logic zero. Consequently, the read and write operations which use the address values supplied at $TA_1$ are synchronized to the signal $\overline{TAS}$. In the present embodiment of the invention this is accomplished by resetting the counters (not shown) in the memory sequencing circuitry 22 which count pulses of the respective signals WCK and RCK, and by scheduling a memory read operation. To indicate that a read, write or refresh operation is scheduled, the memory sequencing circuitry 22 may include, for example, three set-reset latches (not shown). The first, second and third latches are set by the circuitry 22 to schedule a read, a write and a refresh operation, respectively and are reset by the circuitry 22 when the corresponding operation is initiated. To prevent any conflict when more than one operation is scheduled, a priority is established such that a write operation has the highest priority followed by a read operation and then a refresh operation. This priority assignment is somewhat arbitrary although it is generally desirable for refresh operations to have the lowest priority.

Since the counter (not shown), which tallies pulses of the signal WCK is reset by the signal $\overline{TAS}$, the 32 four-bit pixel values, applied to the data input terminals $DI_0$ through $DI_3$ over the 32 periods of the signal WCK following the negative going edge of the signal $\overline{TAS}$ are sequentially stored in the serial-to-parallel converters 38B through 38E. To simplify the explanation of the memory sequencing circuitry 22, it is assumed that the input terminal $\overline{WE}$ is held at a logic zero value so that none of the four-bit pixel values are masked from being written into the memory cell array 50 as set forth above. The entry of pixel data into the serial-to-parallel converters 38 is started at time $TA_1$ when the value of the externally supplied write clock gate signal $\overline{GW}$ is changed to a logic zero.

The time $TC_0$ is at the start of the first memory cycle shown in FIG. 2A. At time $TC_0$, a read operation and a refresh operation are scheduled. According to the priority scheme set forth above, the read operation is initiated first.

The first step in the read operation is to change the signal MC to condition the multiplexer 30 to apply the read address value $AR_0$ from the read address register 24 to the memory address register 31. One clock period after time $TC_0$, the signal LD4 is pulsed to load the read address value into the memory address register 31. The address value held by the register 31 is applied to the row decoding circuitry 34 and column decoding circuitry 36 to select a block of pixel storage cells from the memory cell array 50. Two and one-half periods of the signal CLK after time $TC_0$, the signal ENR is pulsed for five periods of the master clock signal CLK. While the signal ENR has a logic one value, the data output latches 52 are gated onto the bus I/O. Coincident with the negative going edge of the signal ENR, the 32 four-bit pixel values held in the addressed block of pixel storage cells are transferred to the output latches 52. Seven periods of the signal CLK after time $TC_0$, the signal LD1 is pulsed to load the incremented read address value from the incrementing circuitry 32 into the read address register 24.

The data held in the latches 52 at time $TC_1$ is not transferred to the parallel-to-serial converters until a time 32 periods of the signal CLK after time $TA_1$. This time is shortly after time $TB_0$ in FIG. 2A. The delay of 32 master clock periods between the completion of the read operation and the availability of the pixel data at the output terminals $DO_0$ through $DO_3$ allows the memory sequencing circuitry 22 to initiate the read operation, which was initiated in the present example at time $TC_0$, either at time $TC_0$, time $TC_1$ or time $TC_2$. This flexibility ensures that any potential conflict between read, write and refresh operations can be resolved before the data read from the memory cell array 50 is expected at the output port.

At time $TC_1$, the portion of the read operation which accesses the memory cell array 50 is complete. At this time, the refresh operation, which has been scheduled since time $TC_0$, is initiated by the memory sequencing circuitry 22. The circuitry 22 first changes the state of the signal MC to condition the multiplexer 30 to apply the refresh address value from the refresh address register 28 to the memory address register 31. The circuitry 22 then pulses the signal LD4, one master clock period after time $TC_1$, to load the refresh address value into the register 31. On the third clock period after time $TC_1$, a pulse having a width of three clock periods is applied, as the signal REF, to the column decoding circuitry 36 and to the memory cell array 50, to refresh the addressed row of bit-storage cells in each of the four bit planes of the memory cell array 50. Seven master clock periods after the time $TC_1$, the signal LD3 is pulsed to load the ten least significant bits of the incremented refresh address value, as provided by the incrementing circuitry 32, into the refresh address register 28. At time $TC_2$, the refresh operation is complete.

Starting at time $TA_2$, a new address and control value is applied to the serial address input terminal SAD and loaded into the input buffer 10 synchronous with the clock signal $\overline{SAS}$. This address load operation occurs in the same sequence of steps as the one set forth above and is not described in detail. At time $TA_3$, a new read address value, $AR_1$, and a new write address value, $AW_1$, are loaded into the read address latch 16 and write address latch 14, respectively, and new control values $\overline{RF}$, $\overline{WF}$ and $\overline{MF}$, having respective values of zero, zero and one, are loaded into the memory sequencing circuitry 22. The effect of these new address and control values on the operation of the memory system is described below in relation to the description of the memory system in the time following time $TC_5$.

At time $TC_2$, a read operation and a refresh operation have been performed on the memory cell array 50 and no write operation is scheduled, since only 19 four-bit pixel values have been loaded into the serial-to-parallel converters 38. Since no memory operations are scheduled at time $TC_2$ or at time $TC_3$, none are performed. At time $TB_0$, the 32nd pixel value is loaded into the serial-to-parallel converters 38. Coincident with the positive-going edge of the next successive pulse of the signal WCK, the memory sequencing circuitry 22 pulses the signal WLD to transfer the 32 four-bit pixel values from the converters 38 to the input latches 40. At the same time, the circuitry 22 resets its internal counter (not shown) which tallies the pixels applied to the serial-toparallel converters 38 and schedules a memory write operation.

In the example shown in FIG. 2A, the time at which the contents of the serial-to-parallel converters 38 are to be transferred to the latches 40 is 32 periods of the master clock signal CLK after time $TA_1$. This is also the time at which the pixel data values read from the memory cell array 50 having the address $AR_0$ are to be supplied via the output terminals $DO_0$ through $DO_3$. Accordingly, at the same time that the circuitry 22 pulses the signal WLD, it also pulses the signal RLD to transfer the contents of the output buffer latches 52 to the parallel-to-serial converters 54. At this time, the circuitry 22 also schedules the next read operation. Simultaneously, the externally supplied read clock gate signal $\overline{GR}$ and output enable signal $\overline{OE}$ are changed to have logic zero values, enabling the signal RCK and the three-state gates 56. Synchronous with the signal RCK, the 32 four-bit pixel values held in the parallel to serial converters 54 are provided via the output terminals $DO_0$ through $DO_3$.

At time $TC_4$ a read operation and a write operation are scheduled. Since the write operation has a higher priority it is initiated by the memory sequencing circuitry 22. At time $TC_4$ the signal MC is changed by the circuitry 22 to condition the multiplexer 30 to apply the write address value $AW_0$, held in the write address register 26, to the memory address register 31. One master clock period after time $TC_4$, the circuitry 22 pulses the signal LD4 to load the address value $AW_0$ into the register 31. Two master clock periods after time $TC_4$, the memory sequencing circuitry 22 changes the signal $\overline{ENW}$ to a logic zero value, for five periods of the master clock signal, to gate the 32 four-bit pixel values held by the latches 40 onto the data bus I/O. During the time interval that the signal $\overline{ENW}$ has a logic zero value, these 32 pixel values are written into the addressed block of memory storage cells. Seven master clock cycle after time $TC_4$, the signal $CK_2$ is pulsed to load the incremented write address value from the incrementing circuitry 32 into the write address register 26.

Referring to FIG. 2B, at time $TC_5$, the memory write operation is complete and a memory read operation is scheduled. The read and write address values, $AR_1$ and $AW_1$, supplied at time $TA_3$, one-half of one master clock cycle before time $TC_5$, have not yet been propagated to the read and write address registers 24 and 26, respectively. Consequently, the read operation initiated at time $TC_5$ uses the incremented read address value (i.e. $AR_0+1$) from the read address register 24 rather than the newly provided read address value $AR_1$.

The address value $AR_0+1$ is transferred from the read address register 24 to the memory address register 31 by the signal LD4 emitted by the memory sequencing circuitry 22 one master clock period after time $TC_5$. Two and one-half master clock periods after time $TC_5$ (or three clock periods after time $TA_3$) the newly provided read and write address values are loaded into the respective read and write address registers 24 and 26 by the memory sequencing circuitry 22 by pulsing the signals SELR, SELW, LD1 and LD2 as set forth above.

The read operation initiated at time $TC_5$ proceeds in the same manner as the read operation which was initiated at time $TC_0$ except that the memory sequencing circuitry 22 does not pulse the signal LD1 seven master clock cycles after $TC_5$ to load the incremented address value into the register 24. The memory sequencing circuitry disables the signals LD1 and LD2 to prevent the newly loaded address values $AR_1$ and $AW_1$ from being overwritten by the incremented address value from a read or write operation which may be in progress as the new address values are supplied. The signals LD1 and LD2 are only disabled when the control value $\overline{MF}$ of the newly loaded address and control signal is a logic one. In this instance, the read and write operations using the newly supplied address values occur only after any currently scheduled read and write operations. When the control value $\overline{MF}$ is a logic zero, the sequencing circuitry 22 schedules a new read operation which overrides any currently scheduled read operation. In addition, it resets the internal counter which tallies the pulses of the signal WCK, postponing the next memory write operation.

Time $TB_1$ is 32 master clock periods after time $TB_0$. In the time interval between the times $TB_0$ and $TB_1$, 32 four-bit pixel values have been stored in the serial-to-parallel converters 38 and 32 four-bit pixel values have been provided by the parallel-to-serial converters 54. Consequently, coincident with the positive going edge of the first pulse of the signal CLK following time $TB_1$, the memory sequencing circuitry 22 pulses the signals RLD and WLD to transfer, respectively, the 32 four-bit pixel values stored in the output latches 52 into the parallel-to-serial converters 54 and the 32 four-bit pixel values held in the serial-to-parallel converters 38 into the input latches 40. The memory sequencing circuitry 22 also schedules a read operation and a write operation, one master clock period after time $TB_1$.

The four-bit pixel values applied to the data input terminals $DI_0$ through $DI_3$ between time $TB_1$ and $TB_2$ are written into the block of pixel value storage cells which is addressed by the write address value $AW_1+1$. In this example, these pixels are to be subsampled in a one-to-two ratio. This subsampling may be performed, for example, to compress the lines of pixel data stored in the memory cell array 50 by one-half to produce a compressed image for a pix-in-pix feature. The subsampling is achieved by applying a bilevel signal, having a frequency that is half the frequency of the master clock signal, as the write clock gate signal $\overline{GW}$. As set forth above, the signal WCK is the logical AND of the master clock signal CLK and an inverted version of the signal $\overline{GW}$. The signal WCK determines which pixel values are loaded into the serial-to-parallel converters 38. It is also used by the memory sequencing circuitry 22 to determine when to transfer the collected pixel values to the input latches 40. The signal WCK after time $TB_1$ is a clock signal having a 25% duty cycle and a frequency that is one-half of the frequency of the signal CLK. Responsive to this signal, the serial-to-parallel converters store only every other one of the four-bit pixel values applied to the input terminals $DI_0$ through $DI_3$. The pixel values that are stored are those occuring coincident with the negative-going edges of the clock signal WCK.

At time $TC_8$, a write request and a read request are pending. According to the priority scheme set forth above, the write request is initiated at time $TC_8$. The 32 four-bit pixel values applied to the memory system in the interval between $TB_0$ and $TB_1$ are written into the block of pixel storage cells that is addressed by the write address value $AW_1$ loaded at time $TA_3$. This write operation is performed in the same manner as the one that was initiated at time $TC_4$. Accordingly, it is not described in detail.

Time $TC_8$ is 64 master clock cycles after time $TC_0$, the time that the previous refresh operation was scheduled. Since the memory system is designed to refresh one row of bit storage cells every 64 master clock cycles, a refresh operation is scheduled at time $TC_8$.

At time $TC_9$, the memory sequencing circuitry 22 initiates a read operation to transfer the 32 four-bit pixel values, addressed by the read address value, $AR_1$, from the memory cell array 50 into the output latches 52. This read operation is performed in the same manner as the one that was initiated at time $TC_0$ and, so, is not described in detail.

The refresh operation, which was scheduled at time $TC_8$, is performed at time $TC_{10}$. This refresh operation proceeds in the same manner as the one initiated at time $TC_1$, consequently, it is not described in detail.

The time $TB_2$ is 32 periods of the clock signal RCK after time $TB_1$. At time $TB_2$, all the 32 four-bit pixel values which had been transferred to the parallel-to-serial converters 54 shortly after time $TB_1$ have been provided by the converters 54 via the output terminals $DO_0$ through $DO_3$. Coincident with the positive-going edge of the first pulse of the master clock signal after time $TB_1$, the memory sequencing circuitry 22 pulses the signal RLD to transfer the 32 four-bit pixel values held in the latches 52 into the parallel-to-serial converters 54. In this example, these values are to be provided at the output terminals $DO_0$ through $DO_3$ at one-half the rate at which the prior pixel values were supplied. This may be desirable, for example, to expand the lines of video samples provided by the memory system to produce a magnified image. The expansion of the lines of samples is accomplished by changing the read clock gate signal, $\overline{GR}$, to be a bilevel signal having a frequency that is one-half the frequency of the signal CLK. This signal, $\overline{GR}$, changes the signal RCK to have a 25% duty cycle and a frequency one-half of the frequency of the signal CLK. Responsive to this signal, RCK, the parallel-to-serial converters 54 provide the 32 four-bit pixel values at the desired rate.

Since the memory sequencing circuitry 22 schedules read and write operations after counting 32 pulses of the respective signals RCK and WCK, no new write operation will be scheduled until a time (not shown) 64 master clock cycles after $TB_1$ and no new read operation will be scheduled until a time (not shown) 64 master clock cycles after $TB_2$.

As set forth above, the read clock gate signal $\overline{GR}$ and write clock gate signal $\overline{GW}$ can be used to control when, and at what rate, data are respectively read from and written into the memory system shown in FIG. 1. The clock signals which load the values into the serial-to-parallel converters 38 and provide values from the parallel-to-serial converters 54 are synchronized to the master clock signal because transfers occur only on the edges of master clock pulses. However, the actual data input and output may be otherwise asynchronous. Data may be applied to or provided by the memory system at any frequency that is a rational fraction of the master clock frequency.

While this memory system is described in the context of video signal processing, it is contemplated that it may also be used in computer data processing applications. For example, the ability to simultaneously and semi-synchronously write and read continuous data streams at respectively different data rates may make this memory system desirable as a data buffer between a microprocessor and a peripheral device, such as a printer, or as an emulator for a mechanical mass storage device, e.g. as a "RAM DISK" device.

What is claimed is:

1. A digital data memory system realized as a single integrated circuit comprising:
    block oriented digital data storage means wherein each block includes D dynamic data storage elements and has a unique address, where D is a positive integer;
    an input port for applying a continuous stream of input data values to the memory system;
    control means, coupled to said input port and to said block oriented digital data storage means, for performing a write operation which includes storing D data values applied via said input port into one of said blocks during a time interval $T_{WR}$, performing a read operation which includes retrieving D data values from one of said blocks during a time interval $T_{RD}$, and performing a refresh operation which includes refreshing at least D data values held in one of said blocks during a time interval $T_{RF}$ where the time intervals $T_{WR}$, $T_{RD}$ and $T_{RF}$ are mutually exclusive;
    a source of data output clock signal having a maximum frequency of $f_c$; and
    data output means, coupled to said block oriented digital data storage means, having a parallel input port for receiving the D data values provided by said block oriented digital data storage means during said time interval $T_{RD}$, and a serial output port for providing the received D data values sequentially in synchronism with D successive pulses of said data output clock signal to provide a continuous stream of output data values;
    wherein said control means is designed to perform one read operation, one write operation and one refresh operation in a time interval not greater than an amount of time represented by a mathematical expression, $D/f_c$ to condition said memory system to store said continuous stream of input data values and to provide said continuous stream of output data values.

2. The digital data memory system set forth in claim 1 wherein the time intervals $T_{WR}$, $T_{RD}$ and $T_{RF}$ each represent an amount of time substantially equal to one-fourth of the amount of time represented by the expression $D/f_c$.

3. The digital data memory system set forth in claim 2 wherein said control means refreshes data values held in said digital data storage means not more than once in any time interval having a length represented by a mathematical expression $2*D/f_c$.

4. A digital data memory system comprising:
    block oriented digital data storage means wherein each block has a unique address and includes D dynamic data storage elements for holding D data values, where D is a positive integer;
    a serial input port for applying a continuous stream of input data values to the memory system;
    a source of data input clock signal having a maximum frequency of $f_c$;
    input buffer means, coupled to said input port, including first shift register means having a serial input port and a parallel output port, for storing D data values applied to said memory system input port synchronous with D successive pulses of said input clock signal, and for providing said D stored data values via said parallel output port;

control means, coupled to said input buffer means and to said block oriented digital data storage means, for conditioning said data storage means, during a time interval $T_{WR}$, to perform a write operation which includes storing the D data values provided by said input buffer means into one of said blocks, for conditioning said data storage means, during a time interval $T_{RD}$, to perform a read operation which includes providing D data values from one of said blocks, and for conditioning said data storage means, during a time interval $T_{RF}$, to perform a refresh operation which includes refreshing at least D data values held in one of said blocks, where the time intervals $T_{WR}$, $T_{RD}$ and $T_{RF}$ are mutually exclusive and where said control means is designed to perform one write operation, one read operation and one refresh operation in a time interval not greater than an amount of time represented by a mathematical expression $D/f_c$ to maintain a data input rate to said block oriented digital data storage means that is not less than a data rate defined by said continuous stream of input data values;

a source of data output clock signal; and output buffer means, coupled to said digital data storage means, including second shift register means having a parallel input port and a serial output port, for storing, in parallel, the D data values provided by said digital data storage means during the time interval $T_{RD}$, and for providing said D data values stored in said second shift register means, in sequence via said serial output port, synchronous with D successive pulses of said data output clock signal as a portion of a continuous stream of output data values.

5. The digital data memory system set forth in claim 4 wherein the time intervals $T_{WR}$, $T_{RD}$ and $T_{RF}$ each represent an amount of time substantially equal to one-fourth of the amount of time represented by the expression $D/f_c$.

6. The digital data memory system set forth in claim 5 wherein said control means conditions said data storage means to refresh data values held in said digital data storage means not more than once in any time interval having a length represented by a mathematical expression $2*D/f_c$.

7. A digital video memory system comprising:

a source of system clock signal having a frequency of $f_c$;

block oriented pixel storage means wherein each block has a unique address and includes D dynamic data storage elements for holding D pixel values, where D is a positive integer;

a serial input port for applying a continuous stream of input pixel values to the memory system;

a serial output port for providing a continuous stream of sequential pixel values from the memory system;

means, coupled to said source of system clock signal for generating a pixel input clock signal having a maximum frequency of $f_c$;

input buffer means, coupled to said input port, including first shift register means having a serial input port and a parallel output port, for storing D pixel values applied to said memory system input port synchronous with D successive pulses of said pixel input clock signal, and for providing said D stored pixel values via said parallel output port;

control means, coupled to said input buffer means and to said pixel storage means, for conditioning said pixel storage means, during a time interval, $T_{WR}$, to perform a write operation which includes storing the D pixel values provided by said input buffer means into one of said blocks, for conditioning said pixel storage means, during a time interval, $T_{RD}$, to perform a read operation which includes providing D pixel values from one of said blocks, and for conditioning said pixel storage means during a time interval, $T_{RF}$, to perform a refresh operation which includes refreshing at least D pixel values held in one of said blocks, where the time intervals $T_{WR}$, $T_{RD}$ and $T_{RF}$ are mutually exclusive and where said control means is designed to condition said pixel storage means to perform one write operation, one read operation and one refresh operation in a time interval not greater than an amount of time represented by a mathematical expression, $D/f_c$, to maintain a data input rate to said pixel storage means and a data output rate from said pixel storage means that are not less than respective data rates of said continuous stream of input data values and said continuous stream of output data values; and output buffer means, coupled to said pixel storage means, including second shift refister means having a parallel input port and a serial output port, for storing, in parallel, the D pixel values provided by said pixel storage means during the time interval $T_{RD}$, and for providing the D pixel values stored in said second shift register means, in sequence, via said memory system output port, synchronous with D successive pulses of said output clock signal.

8. The digital video memory system set forth in claim 7 wherein the time intervals $T_{WR}$, $T_{RD}$ and $T_{RF}$ each represent an amount of time substantially equal to one-fourth of the amount of time represented by the expression $D/f_c$.

9. The digital video memory system set forth in claim 8 wherein:

$f_c$ is substantially equal to 14.32 MHz;

D is substantially equal to 32;

and each of the time intervals $T_{WR}$, $T_{RD}$ and $T_{RF}$ spans eight periods of said system clock signal.

10. The digital video memory system set forth in claim 9 wherein said control means conditions said pixel storage means to refresh data values held in said pixel storage means, not more than once in any 64 successive periods of said system clock signal.

* * * * *